United States Patent
Miyazaki et al.

(10) Patent No.: US 8,815,716 B2
(45) Date of Patent: Aug. 26, 2014

(54) METHOD OF PRODUCING SEMICONDUCTOR DEVICE

(71) Applicant: Sumitomo Electric Industries, Ltd., Osaka (JP)

(72) Inventors: Tomihito Miyazaki, Osaka (JP); Makoto Kiyama, Osaka (JP); Taku Horii, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/084,293

(22) Filed: Nov. 19, 2013

(65) Prior Publication Data

US 2014/0080292 A1 Mar. 20, 2014

Related U.S. Application Data

(62) Division of application No. 13/266,420, filed as application No. PCT/JP2009/071611 on Dec. 25, 2009, now Pat. No. 8,614,446.

(30) Foreign Application Priority Data

May 8, 2009 (JP) ................................. 2009-113836

(51) Int. Cl.
   *H01L 21/20* (2006.01)
(52) U.S. Cl.
   USPC .......................................... 438/478; 438/570
(58) Field of Classification Search
   CPC ........ H01L 33/40; H01L 33/32; H01L 33/387
   USPC ................................................... 438/478, 570
   See application file for complete search history.

(56) References Cited

U.S. PATENT DOCUMENTS

| 5,851,364 A | 12/1998 | Fu et al. |
| 6,217,721 B1 | 4/2001 | Xu et al. |
| 2005/0151255 A1 | 7/2005 | Ando et al. |
| 2006/0163605 A1* | 7/2006 | Miyahara ...................... 257/103 |

FOREIGN PATENT DOCUMENTS

| JP | 09-069565 A | 3/1997 |
| JP | 09-120991 A | 5/1997 |
| JP | 2003-309084 A | 10/2003 |
| JP | 2004-022773 A | 1/2004 |

(Continued)

OTHER PUBLICATIONS

F. Ren et al., "Wide Energy Bandgap Electronic Devices," World Scientific, pp. 152-155 (2003).

(Continued)

*Primary Examiner* — Douglas Menz
(74) *Attorney, Agent, or Firm* — Venable LLP; Michael A. Sartori; Tamatane J. Aga

(57) ABSTRACT

A semiconductor device includes a semiconductor layer (1) containing GaN and an electrode. The electrode includes an electrode main body (6), a connection-use electrode (8) containing Al and formed at a position farther from the semiconductor layer (1) than the electrode main body (6), and a barrier layer (7) formed between the electrode main body (6) and the connection-use electrode (8), the barrier layer (7) containing at least one selected from the group consisting of W, TiW, WN, TiN, Ta, and TaN. A surface roughness RMS of the barrier layer (7) is 3.0 nm or less.

2 Claims, 5 Drawing Sheets

(56) References Cited

FOREIGN PATENT DOCUMENTS

| JP | 2006-196764 A | 7/2006 |
| JP | 2006-237394 A | 9/2006 |
| JP | 2007-227790 A | 9/2007 |

OTHER PUBLICATIONS

H. Otake et al., "Vertical GaN-Based Trench Gate Metal Oxide Semiconductor Field-Effect Transistors on GaN Bulk Substrates," Appl. Phys. Express 1, pp. 011105-1-011105-3 (2008).
Extended European Search Report Issued in European Patent Application No. 09844358.3 on May 29, 2013.

* cited by examiner

METHOD OF PRODUCING SEMICONDUCTOR DEVICE

CROSS-REFERENCE TO RELATED APPLICATIONS

This application is a divisional of U.S. patent application Ser. No. 13/266,420 filed on Oct. 26, 2011, which is a National Stage of International Application No. PCT/JP2009/071611 filed on Dec. 25, 2009, which claims the benefit of Japanese Patent Application No. 2009-113836 filed on May 8, 2008, all of which are incorporated herein by reference in their entirely.

TECHNICAL FIELD

The present invention relates to a semiconductor device and a method of producing the same and, more specifically, to a semiconductor device including a semiconductor layer containing GaN (gallium nitride) and a method of producing the same.

BACKGROUND ART

Since GaN has a band gap in the ultraviolet region, the application of GaN as a material for optical devices such as laser devices that generate short-wavelength light such as blue light or ultraviolet light has been promoted. In such optical devices that use GaN, Au (gold), which has low resistance, has been employed as a material for a pad electrode to which an external wiring line (e.g., wire) is connected.

Because GaN has a wide band gap, high carrier mobility, and high critical electric field, attempts to apply GaN to not only optical devices but also power semiconductor devices such as Schottky barrier diodes (SBDs) and transistors have been increasingly made in recent years. In such power semiconductor devices that use GaN, a wiring line (wire) having a large diameter of 200 μm or more and composed of Al (aluminum) is normally used to provide a connection between a power semiconductor device and an external device because a large current needs to be caused to flow.

For example, Japanese Unexamined Patent Application Publication No. 2006-196764 (PTL 1), F. Ren et al., "Wide Energy Bandgap Electronic Devices", World Scientific, 2003, p. 152-155 (NPL 1), and H. Otake et al., "Vertical GaN-Based Trench Gate Metal Oxide Semiconductor Field-Effect Transistors on GaN Bulk Substrates", Appl. Phys. Express., 1 (2008) 011105 (NPL 2) disclose structures of conventional power semiconductor devices that use GaN. PTL 1 discloses that a diffusion barrier layer composed of $Ti_xW_{1-x}N$ (0<x<1) is disposed between a low-resistance metal layer and a Ni layer that is in Schottky contact with a compound semiconductor layer composed of GaN. NPL 1 discloses a GaN Schottky barrier diode formed on a GaN substrate. In this Schottky barrier diode, a Schottky electrode is composed of Pt/Ti/Au. NPL 2 discloses a GaN-based vertical MOSFET (metal-oxide-semiconductor field-effect transistor) formed on a GaN substrate. In this MOSFET, a gate electrode is composed of Ni (nickel)/Au.

CITATION LIST

Patent Literature

PTL 1: Japanese Unexamined Patent Application Publication No. 2006-196764

Non Patent Literature

NPL 1: F. Ren et al., "Wide Energy Bandgap Electronic Devices", World Scientific, 2003, p. 152-155

NPL 2: H. Otake et al., "Vertical GaN-Based Trench Gate Metal Oxide Semiconductor Field-Effect Transistors on GaN Bulk Substrates", Appl. Phys. Express., 1 (2008) 011105

SUMMARY OF INVENTION

Technical Problem

In the case where a pad electrode in GaN-based power semiconductor devices is composed of Au as before, an alloy is formed between Au constituting the pad electrode and Al contained in a wire because of heat generated when the wire is bonded to the pad electrode or heat generated when the device is driven. Consequently, the quality of the pad electrode may be degraded. Moreover, in power semiconductor devices, a pad electrode needs to have a certain thickness that can withstand the damage caused when a thick Al wire is mounted. The use of Au as a material for the pad electrode increases the cost. Thus, in GaN-based power devices, Al, which is the same material as that of a wire, is used as a material of the pad electrode.

However, when a pad electrode (connection-use electrode) containing Al is employed in GaN-based power devices such as SBDs and vertical MOSFETs, there is a problem in that the characteristics of such devices are degraded due to heat generated when a device is mounted or operated.

Accordingly, an object of the present invention is to provide a semiconductor device in which the degradation of characteristics can be effectively suppressed and a method of producing the semiconductor device.

Solution to Problem

A semiconductor device of the present invention includes a semiconductor layer containing GaN and an electrode. The electrode includes an electrode main body, a connection-use electrode containing Al and formed at a position farther from the semiconductor layer than the electrode main body, and a barrier layer formed between the electrode main body and the connection-use electrode, the barrier layer containing at least one selected from the group consisting of W (tungsten), TiW (titanium tungsten), WN (tungsten nitride), TiN (titanium nitride), Ta (tantalum), and TaN (tantalum nitride). A surface roughness RMS of the barrier layer is 3.0 nm or less.

The inventors of the present invention have found that the characteristics of a semiconductor device including a connection-use electrode containing Al are degraded because Al contained in the connection-use electrode diffuses into a semiconductor layer due to heat. Furthermore, the inventors have found that the diffusion of Al contained in the connection-use electrode formed on a barrier layer can be effectively suppressed by controlling the surface roughness of the barrier layer to be 3.0 nm or less. Therefore, in the present invention, a barrier layer containing at least one selected from the group consisting of W, TiW, WN, TiN, Ta, and TaN is formed between a semiconductor layer and a connection-use electrode so as to have a surface roughness of 3.0 nm or less, whereby the diffusion of Al contained in the connection-use electrode is suppressed and thus the degradation of characteristics can be effectively suppressed.

In the semiconductor device of the present invention, the electrode main body is preferably in Schottky contact with the semiconductor layer. This can add a function of SBDs to the semiconductor device, and high-performance SBDs can be achieved.

In the semiconductor device of the present invention, the barrier layer preferably has a thickness of 3000 Å (0.3 μm) or more.

The inventors have found that an increase in leak current can be effectively suppressed by controlling the thickness of the barrier layer to be 3000 Å or more. Thus, the degradation of characteristics can be more effectively suppressed.

A method of producing a semiconductor device according to an aspect of the present invention includes the following steps. A semiconductor layer containing GaN is formed and an electrode is formed. The step of forming the electrode includes the following steps. An electrode main body is formed. A connection-use electrode containing Al is formed at a position farther from the semiconductor layer than the electrode main body. A barrier layer containing at least one selected from the group consisting of W, TiW, WN, TiN, Ta, and TaN is formed between the electrode main body and the connection-use electrode. In the step of forming the barrier layer, the barrier layer is formed by a sputtering method at an ambient pressure of 0.1 Pa or less at an applied electric power of 300 W or more.

A method of producing a semiconductor device according to another aspect of the present invention includes the following steps. A semiconductor layer containing GaN is formed and an electrode is formed. The step of forming the electrode includes the following steps. An electrode main body is formed. A connection-use electrode containing Al is formed at a position farther from the semiconductor layer than the electrode main body. A barrier layer containing at least one selected from the group consisting of W, TiW, WN, TiN, Ta, and TaN is formed between the electrode main body and the connection-use electrode. In the step of forming the barrier layer, the barrier layer is formed by a sputtering method at an ambient pressure of 0.1 Pa or less while the electrode main body is heated at 135° C. or more.

As a result of intensive study performed to produce the semiconductor device of the present invention, the inventors have found that a barrier layer having a surface roughness RMS of 3.0 nm or less can be formed by controlling ambient pressure and electric power applied within the above-described range or by controlling ambient pressure and heating temperature within the above-described range. Thus, in the present invention, a barrier layer containing at least one selected from the group consisting of W, TiW, WN, TiN, Ta, and TaN can be formed between the semiconductor layer and the connection-use electrode so as to have a surface roughness of 3.0 nm or less. Accordingly, the diffusion of Al contained in the connection-use electrode is suppressed and thus the degradation of characteristics can be effectively suppressed.

Advantageous Effects of Invention

According to the semiconductor device and the method of producing the semiconductor device of the present invention, the degradation of characteristics can be suppressed.

DESCRIPTION OF EMBODIMENTS

Embodiments of the present invention will now be described with reference to the attached drawings.

First Embodiment

Figure 1:
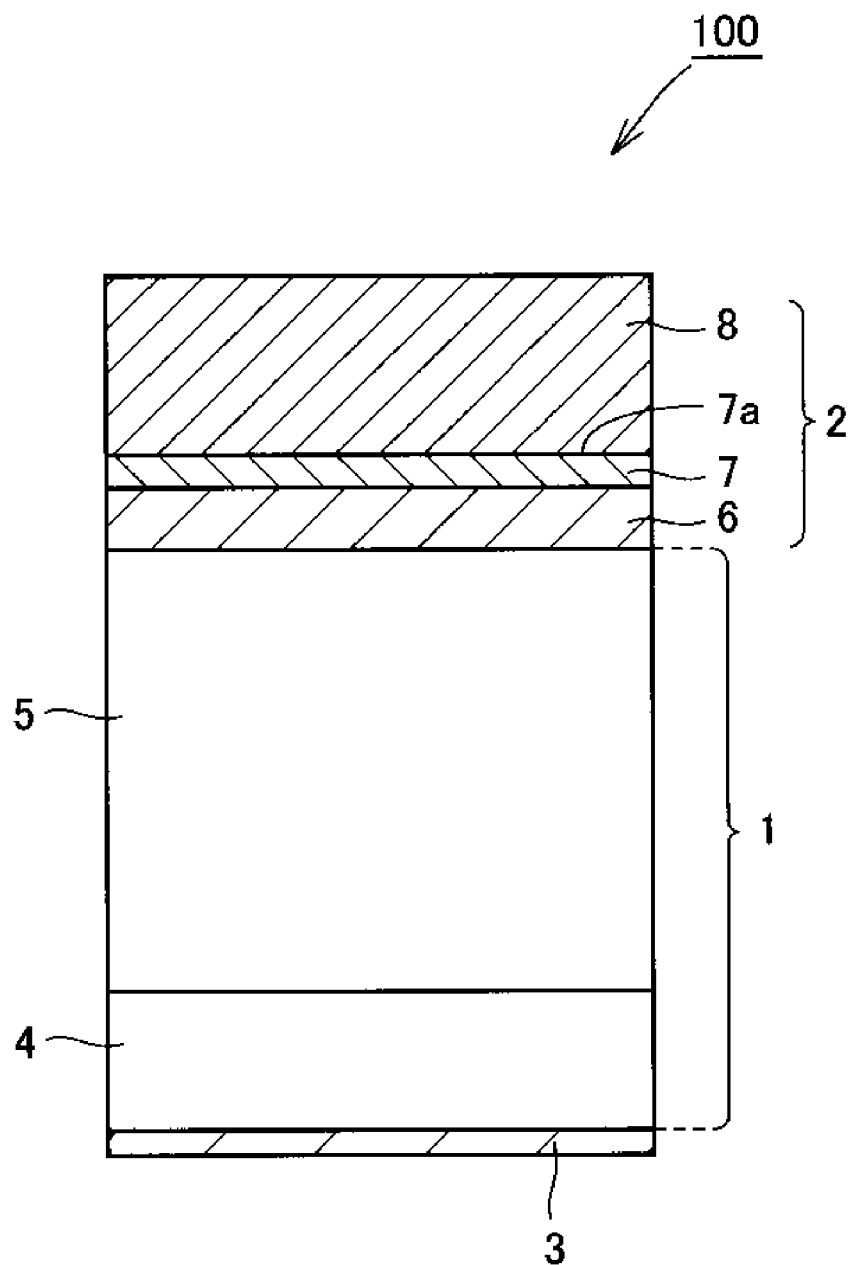
FIG. 1 is a sectional view schematically showing a structure of a semiconductor device according to a first embodiment of the present invention.

FIG. 1 is a sectional view schematically showing a structure of a semiconductor device according to a first embodiment of the present invention. Referring to FIG. 1, an SBD 100 serving as a semiconductor device according to this embodiment includes a semiconductor layer 1, a Schottky electrode 2 serving as an electrode, and an ohmic electrode 3. The Schottky electrode 2 is formed on the upper surface side of the semiconductor layer 1 and the ohmic electrode 3 is formed on the lower surface side of the semiconductor layer 1.

The semiconductor layer 1 includes a substrate 4 and a drift layer 5 formed on the substrate 4. The substrate 4 and the drift layer 5 contain GaN and are composed of, for example, n-type GaN. The n-type impurity concentration of the drift layer 5 is lower than that of the substrate 4.

The Schottky electrode 2 includes an electrode main body 6, a barrier layer 7, and a connection-use electrode (pad electrode) 8. The electrode main body 6 is in contact with the drift layer 5 and forms a Schottky barrier with the drift layer 5. The electrode main body 6 is constituted by, for example, a Ni/Au stacked film, that is, a Ni layer that is in Schottky contact with the drift layer 5 and a Au layer formed on the Ni layer. The barrier layer 7 is formed on the electrode main body 6 and the connection-use electrode 8 is formed on the barrier layer 7. The connection-use electrode 8 is an electrode to which a wiring line (e.g., a wire composed of Al) for electrically connecting an external device to the Schottky electrode of the SBD 100 is directly connected. The connection-use electrode 8 contains Al and is composed of, for example, Al. The barrier layer 7 suppresses the diffusion of Al contained in the connection-use electrode 8 into the semiconductor layer 1, the diffusion being caused by heat. The barrier layer 7 contains at least one selected from the group consisting of W, TiW, WN, TiN, Ta, and TaN. The barrier layer 7 is composed of, for example, W, TiW, WN, TiN, Ta, or TaN.

The surface roughness RMS of a surface 7a of the barrier layer 7 is 3.0 nm or less, preferably 2.0 nm or less, and more preferably 1.4 nm or less. When the surface roughness RMS is 3.0 nm or less, the diffusion of Al contained in the connection-use electrode 8 formed on the barrier layer 7 can be effectively suppressed. When the surface roughness RMS is 2.0 nm or less, the diffusion of Al contained in the connection-use electrode 8 can be more effectively suppressed. When the surface roughness RMS is 1.4 nm or less, the diffusion of Al contained in the connection-use electrode 8 can be most effectively suppressed. Herein, the surface roughness RMS of the surface 7a of the barrier layer 7 is preferably as small as possible, but its lower limit is, for example, 1 nm in view of production process.

Surface roughness RMS means the root-mean-square roughness of a surface specified in JIS B0601, that is, the root-mean-square value of a distance (deviation) from an average surface to a measurement surface.

The barrier layer 7 preferably has a thickness of 3000 Å or more. In this case, an increase in leak current can be suppressed.

The ohmic electrode 3 is composed of a material that is in ohmic contact with the substrate 4 and is constituted by, for example, a Ti/Al/Ti/Au stacked film.

In the SBD 100, when a voltage that exceeds the Schottky barrier formed between the electrode main body 6 and the drift layer 5 is applied between the Schottky electrode 2 and the ohmic electrode 3, an electric current flows from the Schottky electrode 2 to the ohmic electrode 3 through the semiconductor layer 1 in a direction (vertical direction in the drawing) perpendicular to the principal surface of the substrate 4.

A method of producing the SBD 100 according to this embodiment will now be described. First, a drift layer 5 is formed on a substrate 4. Thus, a semiconductor layer 1 can be formed. Subsequently, a Schottky electrode 2 is formed on an upper surface of the drift layer 5 and an ohmic electrode 3 is formed on a lower surface of the substrate 4. In the formation of the Schottky electrode 2, an electrode main body 6 is formed on the upper surface of the drift layer 5, a barrier layer 7 is formed on the electrode main body 6, and then a connection-use electrode 8 is formed on the barrier layer 7. The barrier layer 7 is formed by, for example, a sputtering method.

In a step of forming the barrier layer 7, the barrier layer 7 is formed by a sputtering method at an ambient pressure of 0.1 Pa or less at an applied electric power (sputtering power) of 300 W or more. Alternatively, in a step of forming the barrier layer 7, the barrier layer 7 is formed by a sputtering method at an ambient pressure of 0.1 Pa or less while the electrode main body 6 is heated at 135° C. or more. Preferably, in a step of forming the barrier layer 7, the barrier layer 7 is formed by a sputtering method at an ambient pressure of 0.1 Pa or less at an applied electric power (sputtering power) of 300 W or more while the electrode main body 6 is heated at 135° C. or more.

Herein, the temperature described above means a temperature obtained when an object to be sputtered is disposed in a sputtering apparatus in order to form the barrier layer 7 and the surface of the electrode main body 6 is measured with a thermocouple. For example, by setting the temperature of a heater in the sputtering apparatus to be 250° C. or more, the electrode main body 6 can be heated to 135° C. or more. In this temperature measurement, an RF sputtering apparatus including a magnetron furnace is preferably used as the sputtering apparatus. The upper limit of the heating temperature is, for example, 450° C. to suppress the degradation of Schottky characteristics of the electrode main body 6.

In the case where the electrode main body 6 is heated in the step of forming the barrier layer 7, the heating time is, for example, about one hour.

As described above, the SBD 100 according to this embodiment includes the semiconductor layer 1 containing GaN and the Schottky electrode 2. The Schottky electrode 2 includes the electrode main body 6, the connection-use electrode 8 containing Al and formed at a position farther from the semiconductor layer 1 than the electrode main body 6, and the barrier layer 7 formed between the electrode main body 6 and the connection-use electrode 8. The surface roughness RMS of the barrier layer 7 is 3.0 nm or less.

The method of producing the SBD 100 according to this embodiment includes the following steps. The semiconductor layer 1 containing GaN is formed and the Schottky electrode 2 is formed. The step of forming the Schottky electrode 2 includes the following steps. The electrode main body 6 is formed. The connection-use electrode 8 containing Al is formed at a position farther from the semiconductor layer 1 than the electrode main body 6. The barrier layer 7 is formed between the electrode main body 6 and the connection-use electrode 8. In the step of forming the barrier layer 7, the barrier layer 7 is formed by a sputtering method at an ambient pressure of 0.1 Pa or less at an applied electric power (sputtering power) of 300 W or more. Alternatively, in the step of forming the barrier layer 7, the barrier layer 7 is formed by a sputtering method at an ambient pressure of 0.1 Pa or less while the electrode main body 6 is heated at 135° C. or more.

According to the SBD 100 and the method of producing the SBD 100 in this embodiment, even if the connection-use electrode 8 is heated due to heat generated during mounting (e.g., during die bonding) or heat generated when the SBD 100 is driven, the diffusion of Al contained in the connection-use electrode 8 is prevented by the barrier layer 7, which can suppress the entrance of Al into a Schottky contact interface. In particular, when the surface roughness RMS of the barrier layer 7 is 3.0 nm or less, an increase in the size of the grain boundaries of Al constituting the connection-use electrode 8 formed on the barrier layer 7 can be suppressed. Thus, the penetration of Al constituting the connection-use electrode 8 through the barrier layer 7 in a spiking manner can be suppressed and the diffusion of Al into the Schottky electrode 2 can be suppressed. As a result, the degradation of the characteristics of the SBD 100 caused by self-heating or the like after mounting can be suppressed.

Second Embodiment

Figure 2:
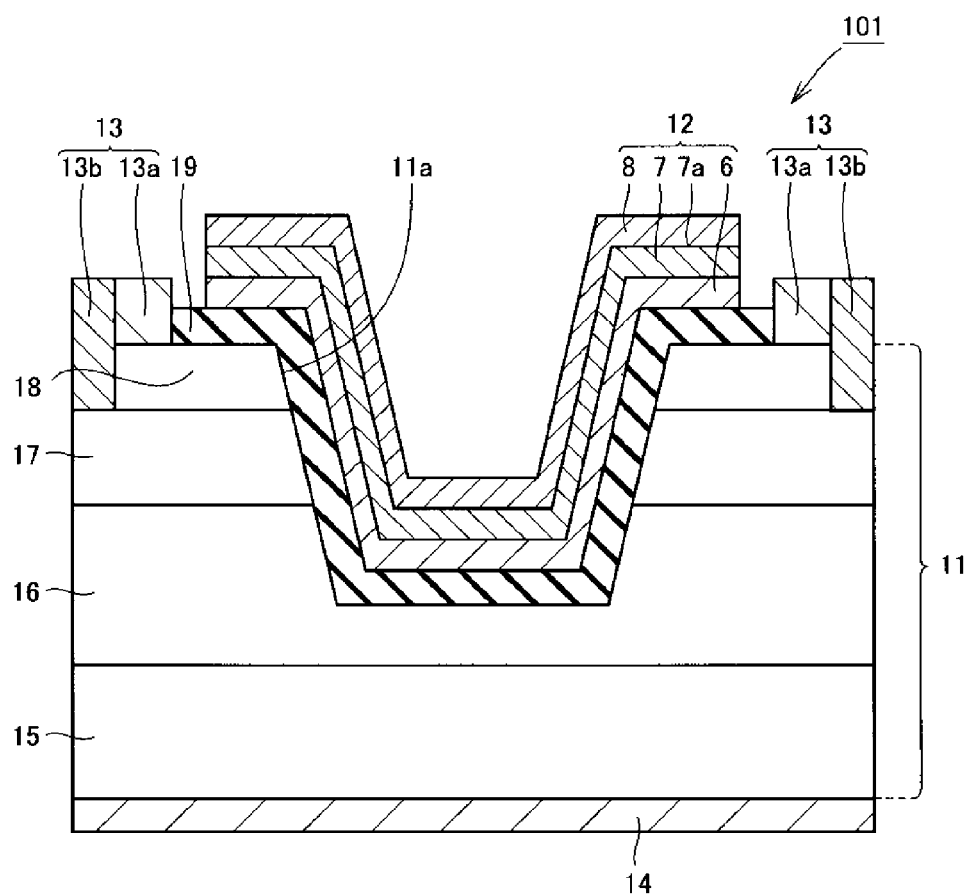
FIG. 2 is a sectional view schematically showing a structure of a semiconductor device according to a second embodiment of the present invention.

FIG. 2 is a sectional view schematically showing a structure of a semiconductor device according to a second embodiment of the present invention. Referring to FIG. 2, a vertical n-channel MOSFET 101 serving as a semiconductor device of this embodiment includes a semiconductor layer 11 and a gate electrode 12, a source electrode 13, and a drain electrode 14, each of which serves as an electrode. A trench 11a is formed on an upper surface of the semiconductor layer 11. The gate electrode 12 is formed on an internal surface of the trench 11a and on the upper surface of the semiconductor layer 11 near the trench 11a with a gate insulating layer 19 therebetween. Furthermore, the source electrode 13 is formed in a portion, of the upper surface of the semiconductor layer 11, where the trench 11a and the gate insulating layer 19 are not formed. The drain electrode 14 is formed on a lower surface of the semiconductor layer 11.

The semiconductor layer 11 includes a substrate 15, an n-type drift layer 16, a p-type body layer 17, and an n-type layer 18. The n-type drift layer 16 is formed on the substrate 15, the p-type body layer 17 is formed on the n-type drift layer 16, and the n-type layer 18 is formed on the p-type body layer 17. The trench 11a penetrates the n-type layer 18 and the p-type body layer 17 and reaches the n-type drift layer 16. Each of the substrate 15, the n-type drift layer 16, the p-type body layer 17, and the n-type layer 18 contains GaN and is composed of, for example, GaN. The n-type impurity concentration of the n-type drift layer 16 is lower than those of the substrate 15 and the n-type layer 18.

The gate electrode 12 includes an electrode main body 6, a barrier layer 7, and a connection-use electrode (pad electrode) 8. The electrode main body 6 is formed on the gate insulating layer 19, the barrier layer 7 is formed on the electrode main body 6, and the connection-use electrode 8 is formed on the barrier layer 7. The connection-use electrode 8 is an electrode to which a wiring line for electrically connecting an external device to the gate electrode 12 of the MOSFET 101 is directly connected. The configurations of the electrode main body 6, the barrier layer 7, and the connection-use electrode 8 are the same as those of the electrode main body, the barrier layer, and the connection-use electrode in the first embodiment, and thus the descriptions thereof are omitted.

The source electrode 13 includes an ohmic electrode 13a and an ohmic electrode 13b. The ohmic electrode 13a is formed so as to surround the trench 11a and is constituted by, for example, a Ti/Al stacked film. The ohmic electrode 13b is formed so as to surround the ohmic electrode 13a and electrically connected to the p-type body layer 17 and the ohmic electrode 13a. The ohmic electrode 13b is constituted by, for example, a Ni/Au stacked film. The drain electrode 14 is formed on the entire lower surface of the substrate 15 and is composed of, for example, Ti/Al.

In the MOSFET 101, when the gate electrode 12 and the drain electrode 14 have a higher potential than the source electrode 13, a channel is formed in the p-type body layer 17 that faces the gate electrode 12 through the gate insulating layer 19 and an electric current flows through this channel. As a result, an electric current flows from the drain electrode 14 to the source electrode 13 through the semiconductor layer 11 in a direction (vertical direction in the drawing) perpendicular to the principal surface of the substrate 15.

A method of producing the MOSFET 101 according to this embodiment will now be described. First, a semiconductor layer 11 is produced by forming an n-type drift layer 16, a p-type body layer 17, and an n-type layer 18 on a substrate 15 in that order. A trench 11a is then formed on an upper surface of the semiconductor layer 11 so as to reach the n-type drift layer 16. A gate insulating layer 19 is formed on an internal surface of the trench 11a, and a gate electrode 12 is formed on the gate insulating layer 19. Subsequently, an ohmic electrode 13a is formed on the n-type layer 18, and the n-type layer 18 located on the periphery of the ohmic electrode 13a is etched to expose the p-type body layer 17. An ohmic electrode 13b is formed so as to be electrically connected to the ohmic electrode 13a and the p-type body layer 17. The ohmic electrode 13a and the ohmic electrode 13b constitute a source electrode 13. A drain electrode 14 is then formed on a lower surface of the substrate 15.

In the formation of the gate electrode 12, an electrode main body 6 is formed on the gate insulating layer 19, a barrier layer 7 is formed on the electrode main body 6, and then a connection-use electrode 8 is formed on the barrier layer 7. The step of forming the barrier layer 7 is the same as that of the first embodiment, and thus the description thereof is omitted.

As described above, the MOSFET 101 according to this embodiment includes the semiconductor layer 11 containing GaN and the gate electrode 12. The gate electrode 12 includes the electrode main body 6, the connection-use electrode 8 containing Al and formed at a position farther from the semiconductor layer 11 than the electrode main body 6, and the barrier layer 7 formed between the electrode main body 6 and the connection-use electrode 8. The surface roughness RMS of the barrier layer 7 is 3.0 nm or less.

The method of producing the MOSFET 101 according to this embodiment includes the following steps. The semiconductor layer 11 containing GaN is formed and the gate electrode 12 is formed. The step of forming the gate electrode 12 includes the following steps. The electrode main body 6 is formed. The connection-use electrode 8 containing Al is formed at a position farther from the semiconductor layer 11 than the electrode main body 6. The barrier layer 7 is formed between the electrode main body 6 and the connection-use electrode 8. In the step of forming the barrier layer 7, the barrier layer 7 is formed by a sputtering method at an ambient pressure of 0.1 Pa or less at an applied electric power of 300 W or more. Alternatively, the barrier layer 7 is formed by a sputtering method at an ambient pressure of 0.1 Pa or less while the electrode main body 6 is heated at 135° C. or more.

According to the MOSFET 101 and the method of producing the MOSFET 101 in this embodiment, even if the connection-use electrode 8 is heated due to heat generated during mounting (e.g., during die bonding) or heat generated when the MOSFET 101 is driven, the diffusion of Al contained in the connection-use electrode 8 is prevented by the barrier layer 7, which can suppress the entrance of Al into a MOS interface. As a result, the degradation of the characteristics of the MOSFET 101 caused by heat can be suppressed.

In this embodiment, the case where the electrode including the electrode main body, the barrier layer, and the connection-use electrode is used as a gate electrode of a MOSFET has been described. However, such an electrode of the present invention may be used as a source electrode of a MOSFET.

Furthermore, in the first and second embodiments, the case where the semiconductor device of the present invention is an SBD or a vertical MOSFET has been described. However, the semiconductor device of the present invention may be, for example, a capacitor, a lateral MOSFET, a high electron mobility transistor, or a bipolar transistor, instead of the above-described devices. In particular, the semiconductor device of the present invention is preferably a vertical device, that is, a device having a current channel which extends in a direction substantially perpendicular to the principal surface of the substrate.

Example 1

In this Example, first, SBDs serving as samples 1 to 6 were produced under the following conditions.

Sample 1 (Invention Example): An SBD having the structure shown in FIG. 1 was produced. Specifically, a GaN free-standing substrate produced by HVPE (hydride vapor phase epitaxy) was prepared. This substrate had an n-type impurity concentration of $3\times10^{18}$ cm$^{-3}$, a thickness of 400 μm, and an average dislocation density of $1\times10^{6}$/cm$^{2}$. Subsequently, a drift layer composed of GaN and having an n-type impurity concentration of $5\times10^{15}$ cm$^{-3}$ and a thickness of 5 μm was epitaxially grown on a (0001) face of the substrate by OMVPE (organometallic vapor phase epitaxy). After the substrate was washed with an organic solvent, an ohmic electrode was formed on a lower surface of the substrate. As the ohmic electrode, a stacked film composed of Ti (thickness: 20 nm)/Al (thickness: 100 nm)/Ti (thickness: 20 nm)/Au (thickness: 300 nm) was formed by an EB (electron beam) evaporation method. Subsequently, the ohmic electrode was heat treated in a nitrogen atmosphere at 600° C. for 1 minute.

Next, a Schottky electrode was formed on an upper surface of the drift layer. The Schottky electrode was formed by forming an electrode main body composed of Ni (thickness: 50 nm)/Au (thickness: 300 nm) by an electron beam evaporation method, forming a barrier layer composed of TiW and having a thickness of 3000 Å on the electrode main body by performing sputtering using an alloy of Ti and W as a target, and forming a connection-use electrode having a thickness of 3 μm by sputtering Al. In the formation of the barrier layer, a magnetron RF sputtering apparatus was used as the sputtering apparatus. The barrier layer was formed by a sputtering method at an ambient pressure of 0.1 Pa at an applied electric power of 300 W without heating the electrode main body. The surface roughness RMS of the barrier layer measured in accordance with JIS B0601 was 2.0 nm.

The Schottky electrode was patterned so as to have a square shape whose side had 1 mm. Specifically, a resist was patterned on the connection-use electrode by photolithography, and Al was etched with a mixed acid etchant (phosphoric acid+nitric acid+acetic acid+pure water) whose temperature was 40° C. using the resist as a mask. Subsequently, the barrier layer was etched with an ammonia etchant (aqueous ammonia+hydrogen peroxide solution+pure water) whose temperature was room temperature. The content of Ti in the barrier layer after etching was measured by an ICP (inductively coupled plasma) analysis. The content of Ti was 8% by mass. Immediately before the evaporation of the ohmic electrode and the Schottky electrode, surfaces to be evaporated were treated with an aqueous HCl solution (hydrochloric acid for semiconductors:pure water=1:10) whose temperature was room temperature for 3 minutes.

Sample 2 (Invention Example): A sample 2 was different from the sample 1 in terms of the formation method of the barrier layer. Specifically, the Schottky electrode was formed by forming an electrode main body composed of Ni (thickness: 50 nm)/Au (thickness: 300 nm) by an electron beam evaporation method, forming a barrier layer on the electrode main body by a sputtering method at an ambient pressure of 0.1 Pa at an applied electric power of 300 W while the electrode main body was heated at 135° C., and then forming a connection-use electrode having a thickness of 3 μm on a TiW layer by sputtering Al. The barrier layer had a surface roughness RMS of 1.4 nm and a thickness of 3000 Å. The production method other than the above-described method was the same as that of the sample 1.

Sample 3 (Invention Example): A sample 3 was different from the sample 1 in terms of the formation method of the barrier layer. Specifically, the Schottky electrode was formed by forming an electrode main body composed of Ni (thickness: 50 nm)/Au (thickness: 300 nm) by an electron beam evaporation method, forming a barrier layer on the electrode main body by a sputtering method at an ambient pressure of 0.1 Pa at an applied electric power of 50 W while the electrode main body was heated at 135° C., and then forming a connection-use electrode having a thickness of 3 μm on a TiW layer by sputtering Al. The barrier layer had a surface roughness RMS of 3.0 nm and a thickness of 3000 Å. The production method other than the above-described method was the same as that of the sample 1.

Sample 4 (Comparative Example): A sample 4 was different from the sample 1 in terms of the formation method of the barrier layer. Specifically, the Schottky electrode was formed by forming an electrode main body composed of Ni (thickness: 50 nm)/Au (thickness: 300 nm) by an electron beam evaporation method, forming a barrier layer on the electrode main body by a sputtering method at an ambient pressure of 0.1 Pa at an applied electric power of 50 W without heating the electrode main body, and then forming a connection-use electrode having a thickness of 3 μm on a TiW layer by sputtering Al. The barrier layer had a surface roughness RMS of 3.2 nm and a thickness of 3000 Å. The production method other than the above-described method was the same as that of the sample 1.

Sample 5 (Comparative Example): A sample 5 was different from the sample 1 in that the barrier layer was not formed. Specifically, the Schottky electrode was formed by forming an electrode main body composed of Ni (thickness: 50 nm)/Au (thickness: 300 nm) by an electron beam evaporation method and then forming a connection-use electrode having a thickness of 3 μm on the electrode main body by sputtering Al without forming a barrier layer. In the patterning of the Schottky electrode, Al was etched with a mixed acid etchant (phosphoric acid+nitric acid+acetic acid+pure water) whose temperature was 40° C. The production method other than the above-described method was the same as that of the sample 1.

Sample 6 (Comparative Example): A sample 6 was different from the sample 1 in terms of the formation method of the barrier layer. Specifically, the Schottky electrode was formed by forming an electrode main body composed of Ni (thickness: 50 nm)/Au (thickness: 300 nm) by an electron beam evaporation method, forming a Ti layer having a thickness of 0.15 μm, and then forming a connection-use electrode having a thickness of 3 μm on the Ti layer by sputtering Al. In the patterning of the Schottky electrode, Al was etched with a mixed acid etchant (phosphoric acid+nitric acid+acetic acid+ pure water) whose temperature was 40° C., and subsequently the Ti layer was etched with an ammonia etchant (aqueous ammonia+hydrogen peroxide solution+pure water) whose temperature was room temperature. The production method other than the above-described method was the same as that of the sample 1.

The thermal stability of the samples 1 to 6 was evaluated. Specifically, the samples 1 to 6 were heat treated (annealed) at 350° C., which was assumed to be a temperature during the mounting (die bonding) of the SBD. Before and after the heat treatment, the current density as a function of reverse voltage was measured. FIGS. 3 to 7 and Table I show the results. The leak current in Table I means an increase in current density between before heat treatment and after heat treatment, regarding the current density obtained when a reverse voltage of 350 V is applied.

TABLE I

|  | RMS(nm) | Leak current |
|---|---|---|
| Sample 1 | 2.0 | One-digit increase |
| Sample 2 | 1.4 | No increase |
| Sample 3 | 3.0 | One-digit increase |
| Sample 4 | 3.2 | Four-digit increase |

Figure 3:
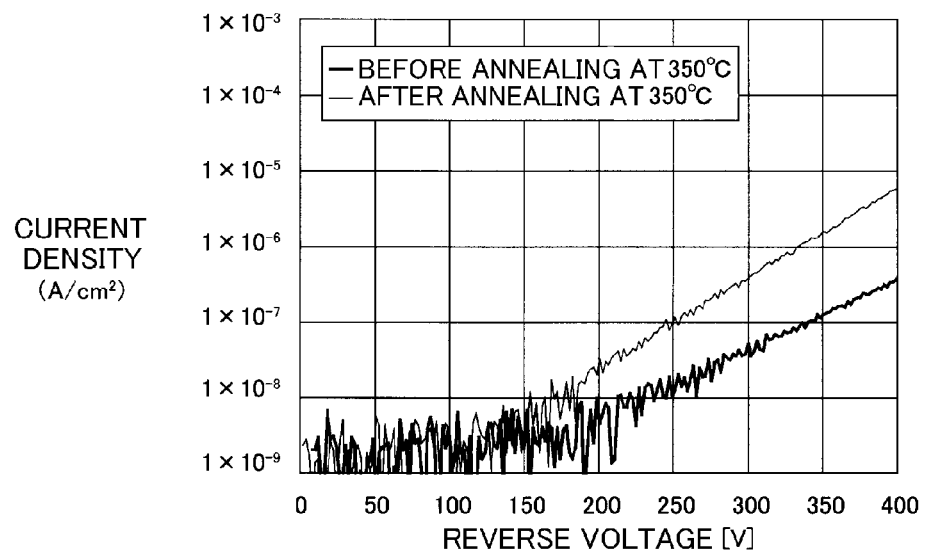
FIG. 3 is a diagram showing a change in current density as a function of reverse voltage in a sample 1 of Example 1 of the present invention.
Figure 4:
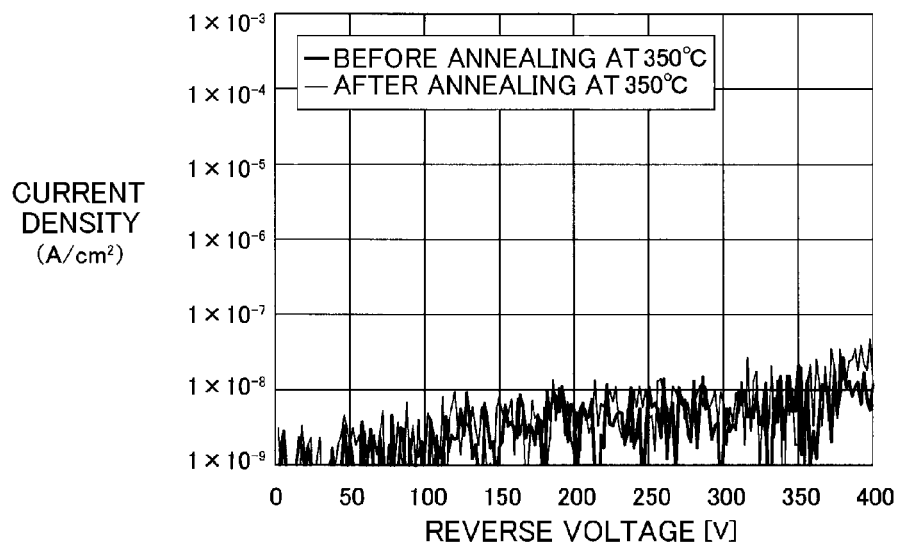
FIG. 4 is a diagram showing a change in current density as a function of reverse voltage in a sample 2 of Example 1 of the present invention.
Figure 5:
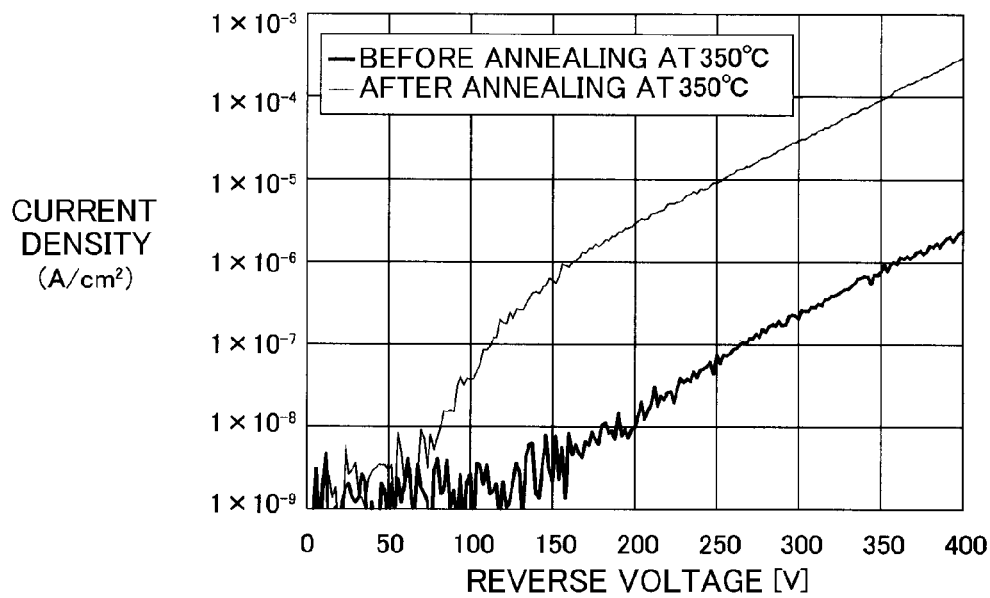
FIG. 5 is a diagram showing a change in current density as a function of reverse voltage in a sample 3 of Example 1 of the present invention.

FIGS. 3 to 6 are diagrams showing a change in current density as a function of reverse voltage in the samples 1 to 4 of Example 1 of the present invention. FIG. 7 is a diagram showing a change in current density as a function of reverse voltage in the samples 5 and 6 of Example 1 of the present invention. Referring to FIGS. 3 to 5 and Table I, in the samples 1 to 3 including a barrier layer having a surface roughness RMS of 3.0 nm or less, a significant change in current density as a function of reverse voltage was not seen and thus the degradation of characteristics caused by heating was effectively suppressed. In particular, in the sample 2 in which the surface roughness RMS was 1.4 nm or less, the degradation of characteristics caused by heating was highly effectively suppressed.

Figure 6:
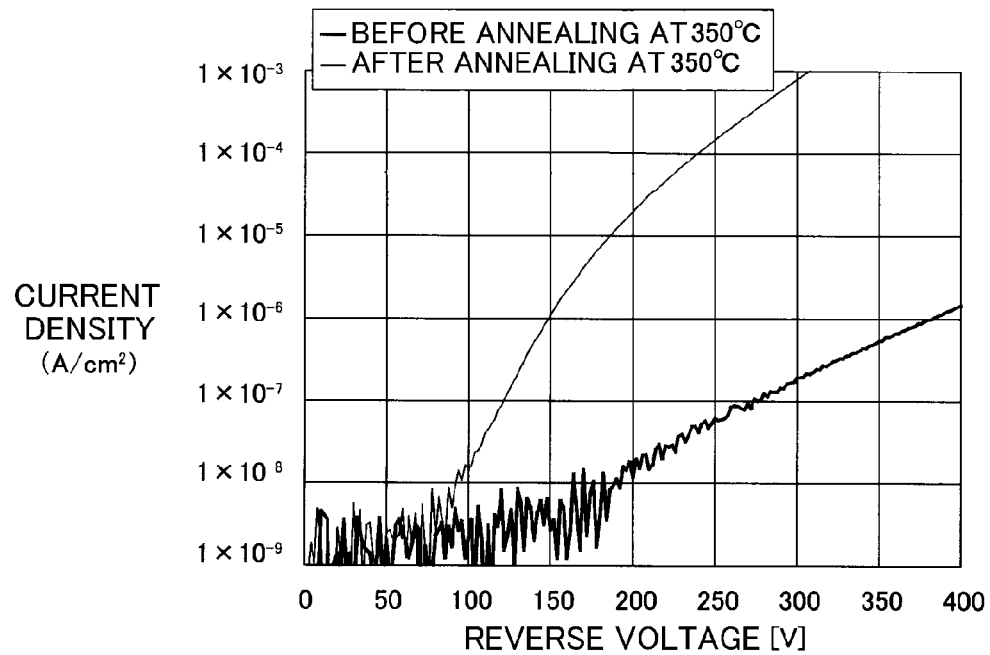
FIG. 6 is a diagram showing a change in current density as a function of reverse voltage in a sample 4 of Example 1 of the present invention.
Figure 7:
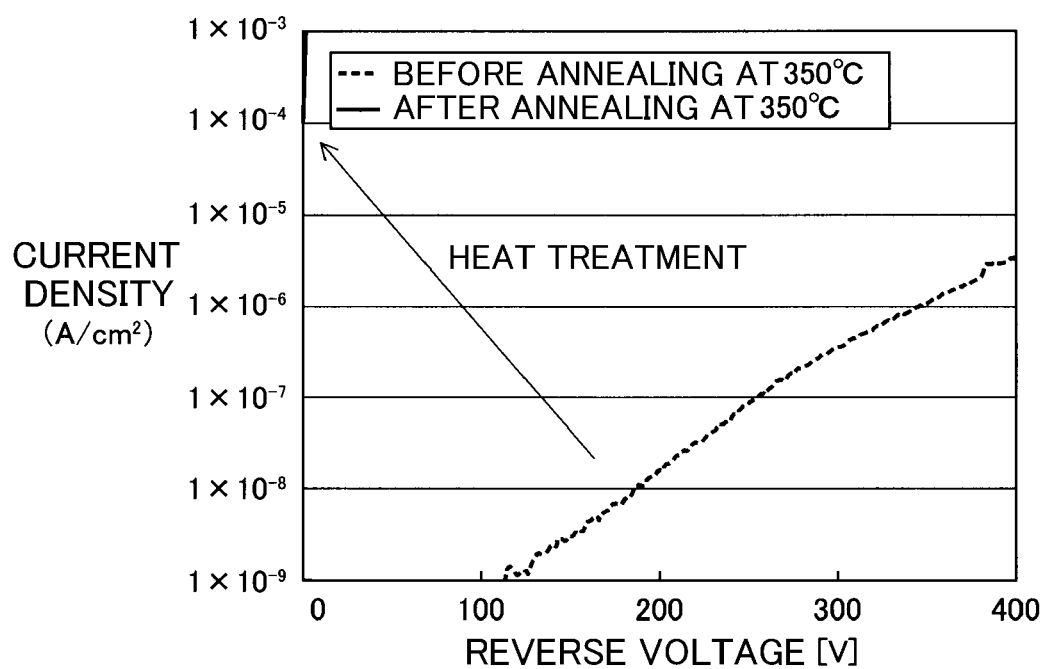
FIG. 7 is a diagram showing a change in current density as a function of reverse voltage in samples 5 and 6 of Example 1 of the present invention.

On the other hand, referring to FIG. 6 and Table I, in the sample 4 including a barrier layer having a surface roughness RMS of more than 3.0 nm, a significant change in current density as a function of reverse voltage was seen and thus the degradation of characteristics caused by heating was seen. Furthermore, referring to FIG. 7, in the samples 5 and 6 that did not include the barrier layer of the present invention, the current density as a function of reverse voltage after heat treatment was extremely increased, and thus the degradation of characteristics caused by heating was considerably seen.

According to this Example, it was found that the degradation of characteristics could be suppressed by forming a barrier layer and furthermore the degradation of characteristics could be effectively suppressed by controlling the surface roughness RMS of the barrier layer to be 3.0 nm or less.

Example 2

In this Example, the conditions that a barrier layer having a surface roughness RMS of 3.0 nm or less is formed were examined. Therefore, in this Example, in addition to the samples 1 to 4, SBDs serving as samples 7 and 8 were produced under the following conditions.

Sample 7 (Comparative Example): A sample 7 was different from the sample 1 in terms of the formation method of the barrier layer. Specifically, the Schottky electrode was formed by forming an electrode main body composed of Ni (thickness: 50 nm)/Au (thickness: 300 nm) by an electron beam evaporation method, forming a barrier layer on the electrode main body by a sputtering method at an ambient pressure of 0.5 Pa at an applied electric power of 300 W without heating the electrode main body, and then forming a connection-use electrode having a thickness of 3 μm on a TiW layer by sputtering Al. The barrier layer had a thickness of 3000 Å. The production method other than the above-described method was the same as that of the sample 1.

Sample 8 (Comparative Example): A sample 8 was different from the sample 1 in terms of the formation method of the barrier layer. Specifically, the Schottky electrode was formed by forming an electrode main body composed of Ni (thickness: 50 nm)/Au (thickness: 300 nm) by an electron beam evaporation method, forming a barrier layer on the electrode main body by a sputtering method at an ambient pressure of 1.5 Pa at an applied electric power of 300 W without heating the electrode main body, and then forming a connection-use electrode having a thickness of 3 μm on a TiW layer by sputtering Al. The barrier layer had a thickness of 3000 Å. The production method other than the above-described method was the same as that of the sample 1.

As in the samples 1 to 4, the surface roughness RMS of the barrier layer of the samples 7 and 8 was also measured in accordance with JIS B0601. Table II shows the results.

TABLE II

| | Pressure (Pa) | Electric power(W) | Heating temperature(° C.) | Thickness (Å) | RMS(nm) |
|---|---|---|---|---|---|
| Sample 1 | 0.1 | 300 | — | 3000 | 2.0 |
| Sample 2 | 0.1 | 300 | 135 | 3000 | 1.4 |
| Sample 3 | 0.1 | 50 | 135 | 3000 | 3.0 |

TABLE II-continued

| | Pressure (Pa) | Electric power(W) | Heating temperature(° C.) | Thickness (Å) | RMS(nm) |
|---|---|---|---|---|---|
| Sample 4 | 0.1 | 50 | — | 3000 | 3.2 |
| Sample 7 | 0.5 | 300 | — | 3000 | 4.6 |
| Sample 8 | 1.5 | 300 | — | 3000 | 5.1 |

As shown in Table II, in the samples 1 and 2 in which the barrier layer was formed by a sputtering method at an ambient pressure of 0.1 Pa or less at an applied electric power of 300 W or more, the surface roughness RMS was 2.0 nm or less. In the samples 2 and 3 in which the barrier layer was formed by a sputtering method at an ambient pressure of 0.1 Pa or less while the electrode main body was heated at 135° C. or more, the surface roughness RMS was 3.0 nm or less. Furthermore, in the sample 2 in which the barrier layer was formed by a sputtering method at an ambient pressure of 0.1 Pa or less at an applied electric power of 300 W or more while the electrode main body was heated at 135° C. or more, the surface roughness RMS was 1.4 nm or less.

On the other hand, in the samples 4, 7, and 8 that did not satisfy any of the conditions, the barrier layer had a surface roughness RMS of 3.2 nm or more.

According to this Example, it was found that the surface roughness RMS of the barrier layer was decreased to be 3.0 nm or less by controlling sputtering conditions such as ambient pressure and electric power applied or ambient pressure and heating temperature.

It should be understood that the embodiments and examples disclosed above are merely illustrative and in no way limit the scope of the invention. The scope of the invention is defined by the appended claims, not the preceding disclosure, and includes all modifications and alterations within the scope defined by the appended claims and equivalents thereof.

INDUSTRIAL APPLICABILITY

The present invention is suitable as a power semiconductor device composed of a GaN-based material.

The invention claimed is:

1. A method of producing a semiconductor device comprising:
a step of forming a semiconductor layer containing gallium nitride; and
a step of forming an electrode,
wherein the step of forming the electrode includes a step of forming an electrode main body, a step of forming a connection-use electrode containing aluminum at a position farther from the semiconductor layer than the electrode main body, and a step of forming a barrier layer between the electrode main body and the connection-use electrode, the barrier layer containing at least one selected from the group consisting of W, TiW, and Ta,
in the step of forming the barrier layer, the barrier layer is formed by a sputtering method at an ambient pressure of 0.1 Pa or less at an applied electric power of 300 W or more, and
wherein the step of forming the electrode main body includes a step of forming a Ni layer that is in Schottky contact with the semiconductor layer and a step of forming an Au layer on the Ni layer.

2. A method of producing a semiconductor device comprising:
- a step of forming a semiconductor layer containing gallium nitride; and
- a step of forming an electrode,
- wherein the step of forming the electrode includes a step of forming an electrode main body, a step of forming a connection-use electrode containing aluminum at a position farther from the semiconductor layer than the electrode main body, and a step of forming a barrier layer between the electrode main body and the connection-use electrode, the barrier layer containing at least one selected from the group consisting of W, TiW, and Ta,
- in the step of forming the barrier layer, the barrier layer is formed by a sputtering method at an ambient pressure of 0.1 Pa or less while the electrode main body is heated at 135° C. or more, and
- wherein the step of forming the electrode main body includes a step of forming a Ni layer that is in Schottky contact with the semiconductor layer and a step of forming an Au layer on the Ni layer.

* * * * *